(12) United States Patent
Park et al.

(10) Patent No.: US 10,510,926 B2
(45) Date of Patent: Dec. 17, 2019

(54) ULTRAVIOLET LIGHT EMITTING DIODE AND LIGHT EMITTING DIODE PACKAGE

(71) Applicant: LG INNOTEK CO., LTD., Seoul (KR)

(72) Inventors: Chan Keun Park, Seoul (KR); Sul Hee Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 158 days.

(21) Appl. No.: 15/747,294

(22) PCT Filed: Jul. 25, 2016

(86) PCT No.: PCT/KR2016/008116
§ 371 (c)(1),
(2) Date: Jan. 24, 2018

(87) PCT Pub. No.: WO2017/018767
PCT Pub. Date: Feb. 2, 2017

(65) Prior Publication Data
US 2018/0219126 A1    Aug. 2, 2018

(30) Foreign Application Priority Data

Jul. 24, 2015  (KR) .......................... 10-2015-0105196

(51) Int. Cl.
*H01L 33/06*     (2010.01)
*H01L 33/14*     (2010.01)
(Continued)

(52) U.S. Cl.
CPC ............ *H01L 33/145* (2013.01); *H01L 33/04* (2013.01); *H01L 33/06* (2013.01); *H01L 33/14* (2013.01);
(Continued)

(58) Field of Classification Search
None
See application file for complete search history.

(56) References Cited

U.S. PATENT DOCUMENTS 6,337,493 B1    1/2002  Tanizawa et al.
8,759,815 B2 *  6/2014  Jeon ..................... H01L 33/06
                                                      257/100
(Continued)

FOREIGN PATENT DOCUMENTS

JP    2000-307149    11/2000
JP    2006-332611    12/2006
(Continued)

OTHER PUBLICATIONS

International Search Report dated Nov. 16, 2016 issued in Application No. PCT/KR2016/008116.

*Primary Examiner* — Minh Loan Tran
(74) *Attorney, Agent, or Firm* — Ked & Associates, LLP

(57) ABSTRACT

An embodiment relates to an ultraviolet light-emitting device, a method for manufacturing an ultraviolet light-emitting device, a light-emitting device package and an illumination apparatus. The ultraviolet light-emitting device includes a first conductive-type semiconductor layer; an active layer comprising a plurality of quantum walls and a plurality of quantum wells and disposed on the first conductive-type semiconductor layer; a second conductive-type first semiconductor layer disposed on the active layer; an electron blocking layer disposed between the active layer and the second conductive-type first semiconductor layer; and a second conductive-type second semiconductor layer disposed between the last quantum wall of the active layer and the electron blocking layer, wherein the second conductive-type second semiconductor layer includes a p-type $Al_{x1}Ga_{1-x1}N$ layer ($0 \le x1 \le 1$) and a p-type $In_yAl_{x2}Ga_{1-y-x2}N$ layer ($0 \le x2 \le 1$, $0 \le y \le 1$, $0 \le x2+y \le 1$).

20 Claims, 7 Drawing Sheets

(51) Int. Cl.
*H01L 33/48* (2010.01)
*H01L 33/04* (2010.01)
*H01L 33/32* (2010.01)
*H01L 33/50* (2010.01)
*H01L 33/54* (2010.01)
*H01L 33/62* (2010.01)
*H01L 33/64* (2010.01)
*H01L 33/22* (2010.01)
*H01L 33/40* (2010.01)
*H01L 33/00* (2010.01)

(52) U.S. Cl.
CPC .............. *H01L 33/32* (2013.01); *H01L 33/48* (2013.01); *H01L 33/502* (2013.01); *H01L 33/54* (2013.01); *H01L 33/62* (2013.01); *H01L 33/647* (2013.01); *H01L 33/0079* (2013.01); *H01L 33/22* (2013.01); *H01L 33/405* (2013.01); *H01L 2224/48091* (2013.01)

(56) References Cited

U.S. PATENT DOCUMENTS

| | | | |
|---|---|---|---|
| 9,190,571 B2 * | 11/2015 | Choi | ............... H01L 33/325 |
| 2006/0244003 A1 | 11/2006 | Ueda et al. | |
| 2012/0012815 A1 * | 1/2012 | Moon | ............... H01L 33/06 |
| | | | 257/13 |
| 2013/0299775 A1 | 11/2013 | Jeon et al. | |
| 2014/0110720 A1 | 4/2014 | Choi et al. | |

FOREIGN PATENT DOCUMENTS

| | | |
|---|---|---|
| KR | 10-2012-0034952 | 4/2012 |
| KR | 10-2012-0132979 | 12/2012 |
| KR | 10-2013-0103070 | 9/2013 |
| KR | 10-2014-0050247 | 4/2014 |

* cited by examiner

【FIG. 1】
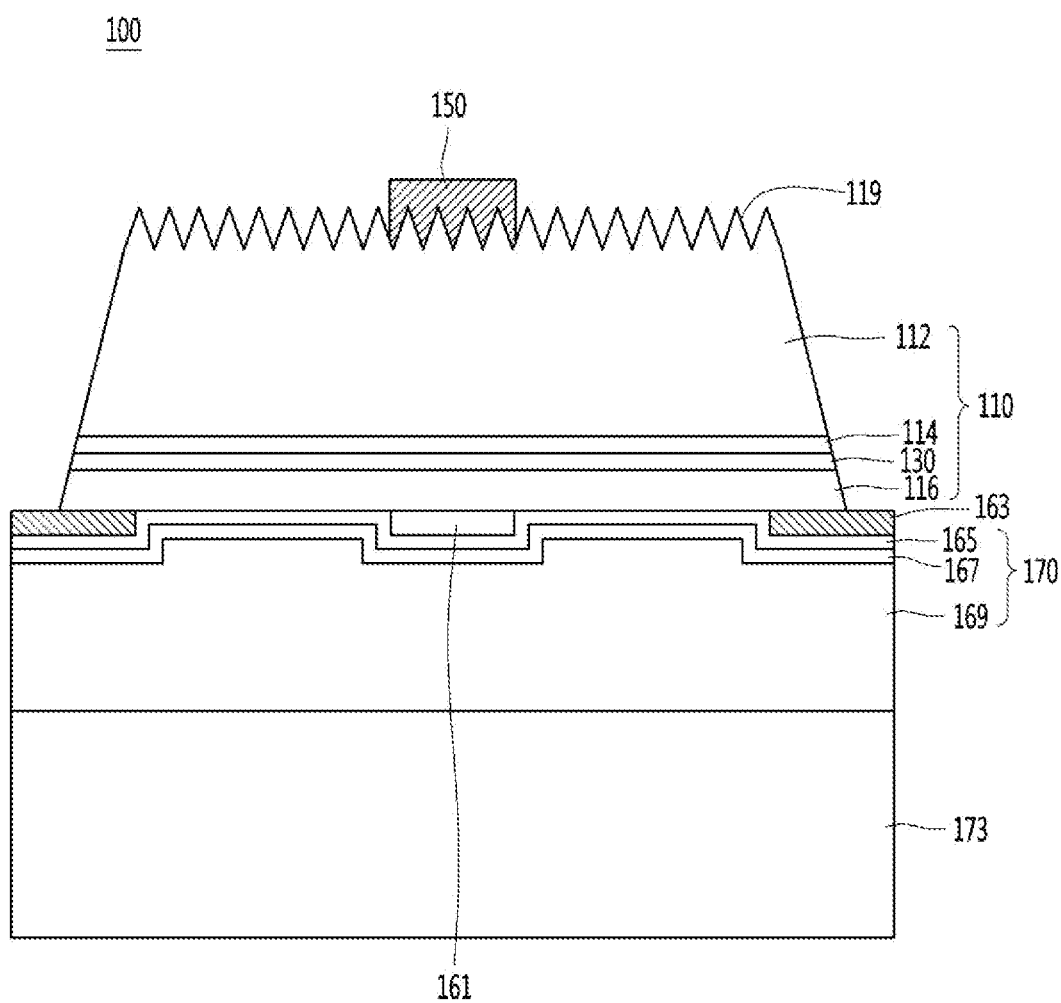

[FIG. 2]
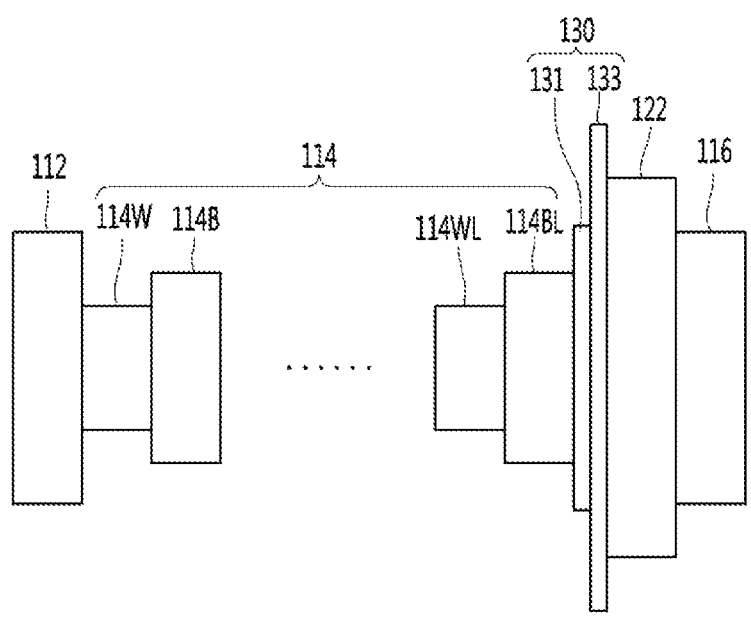

[FIG. 3]
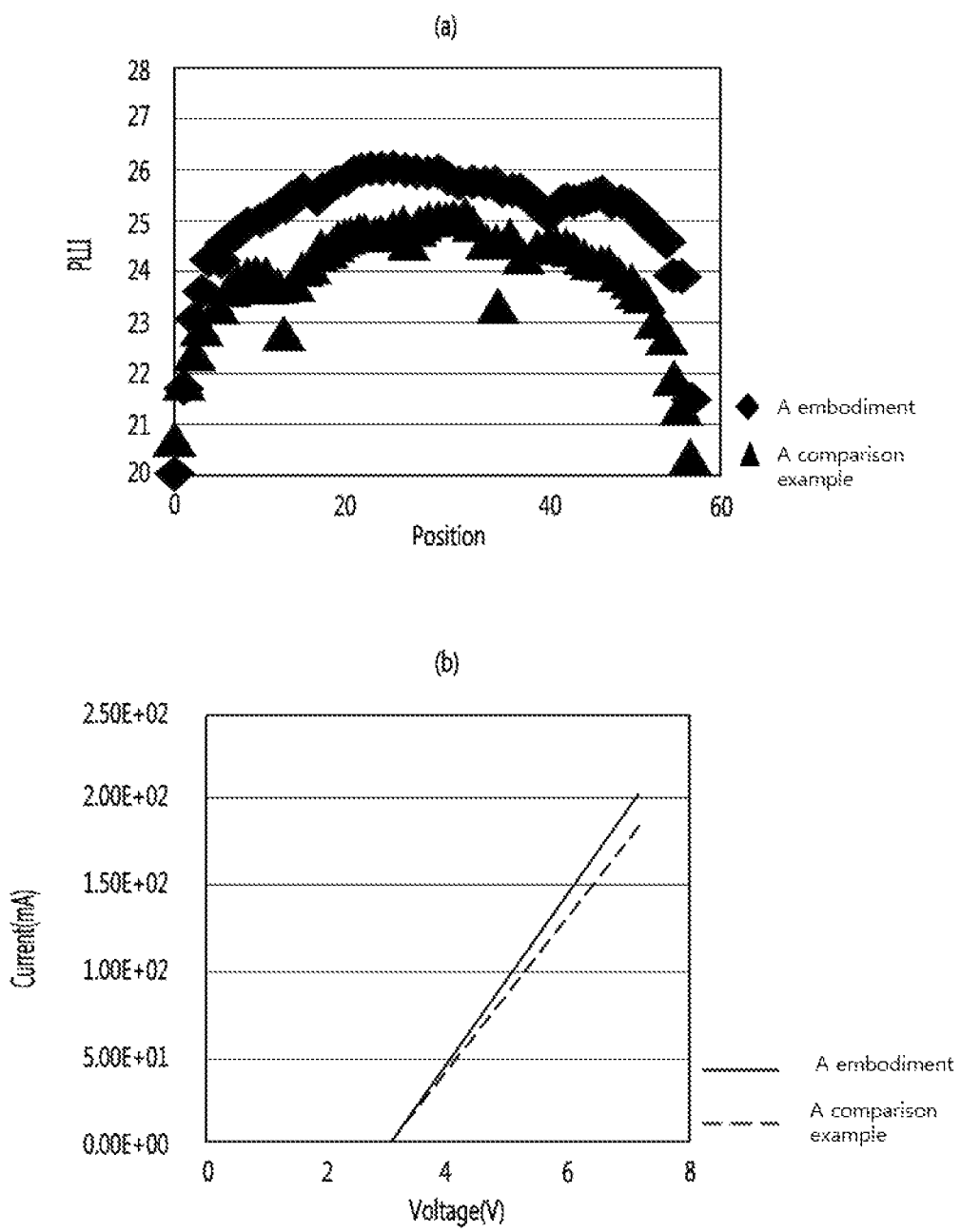

【FIG. 4】
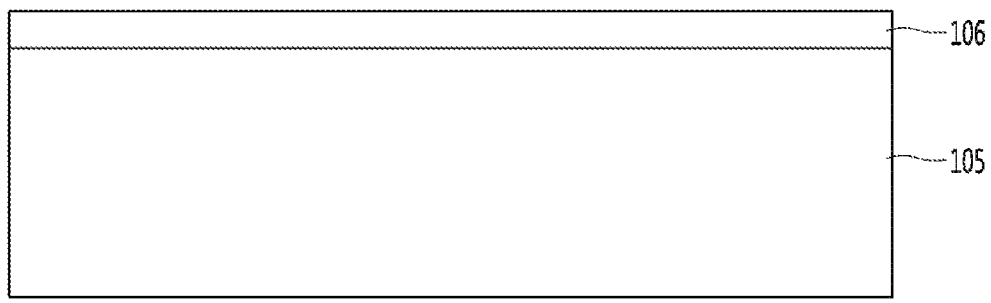
【FIG. 5】
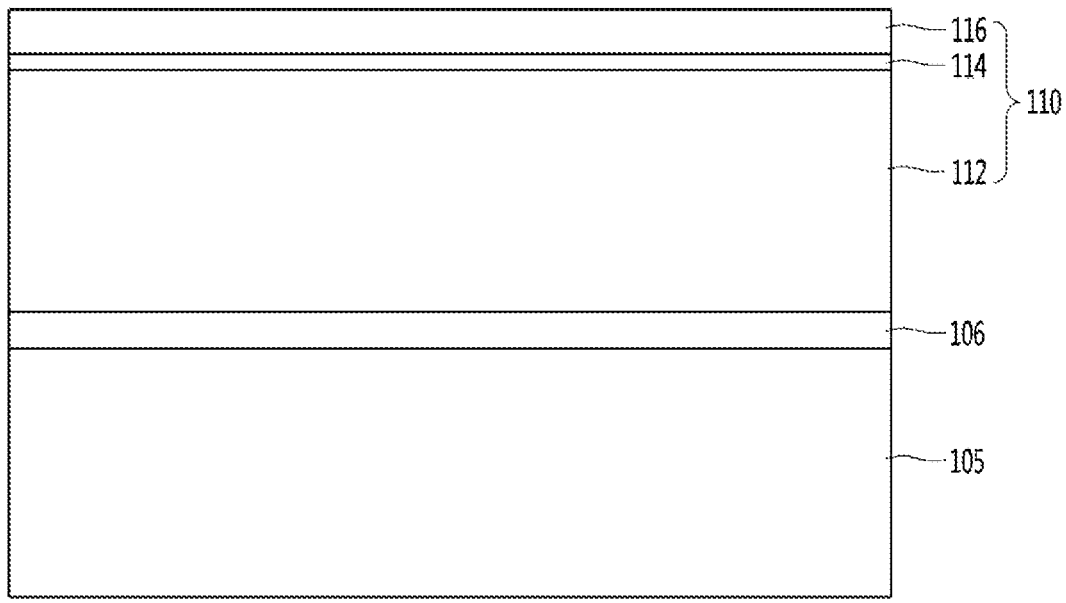

[FIG. 6]
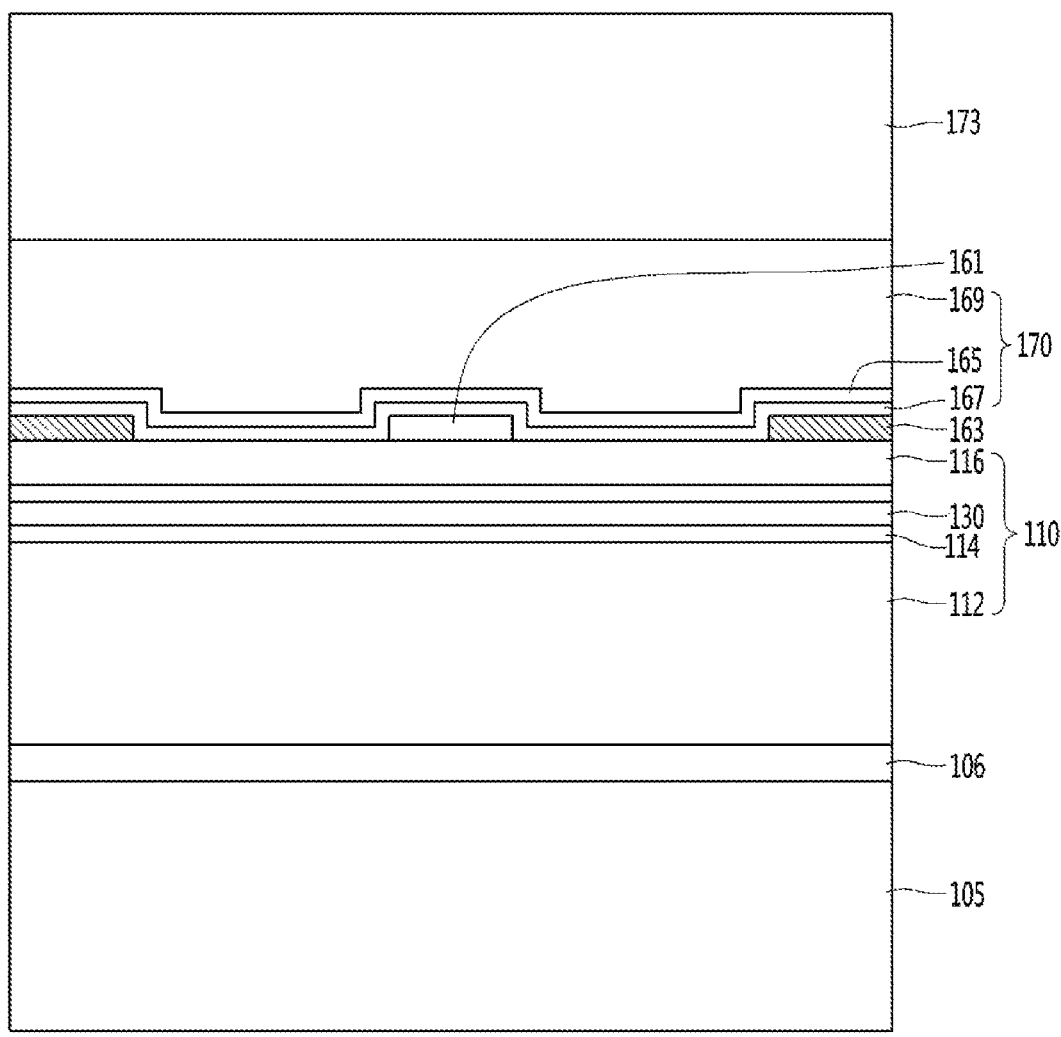

[FIG. 7]
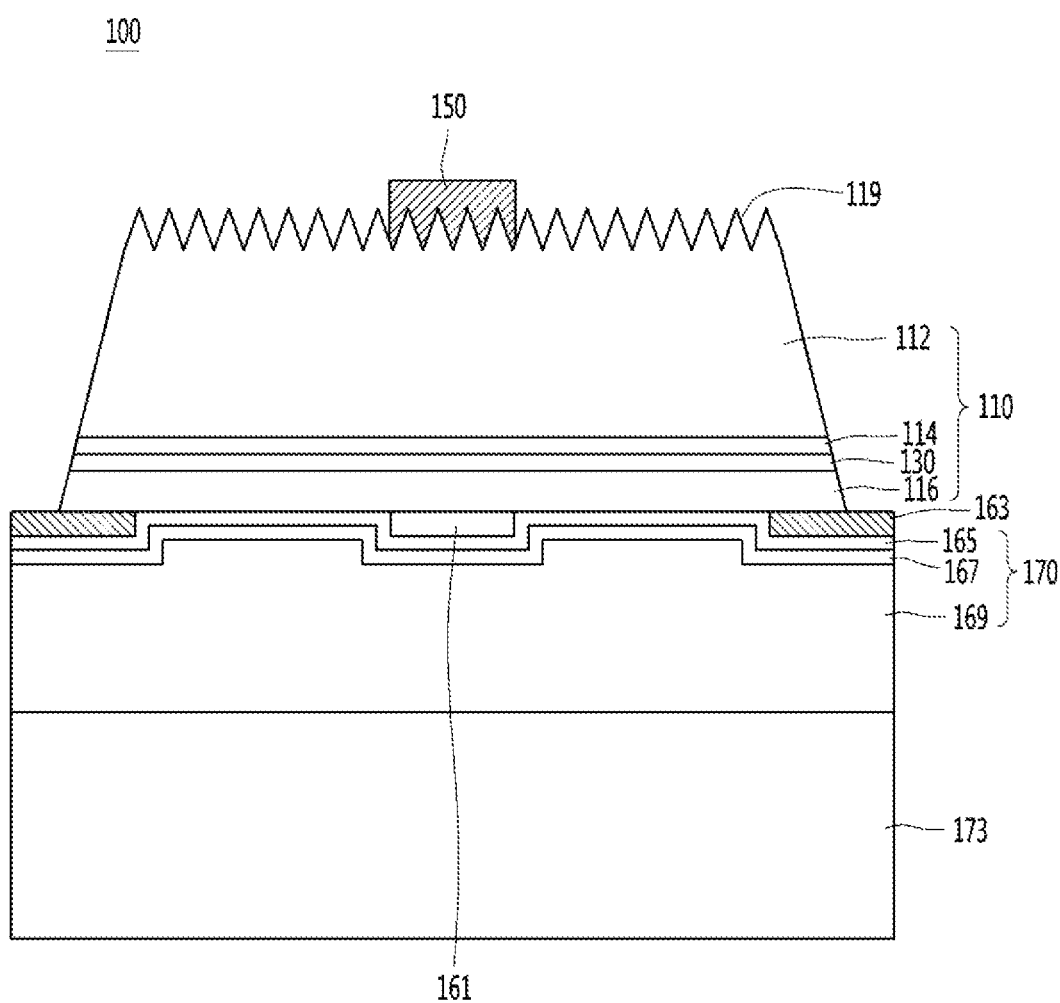

[FIG. 8]
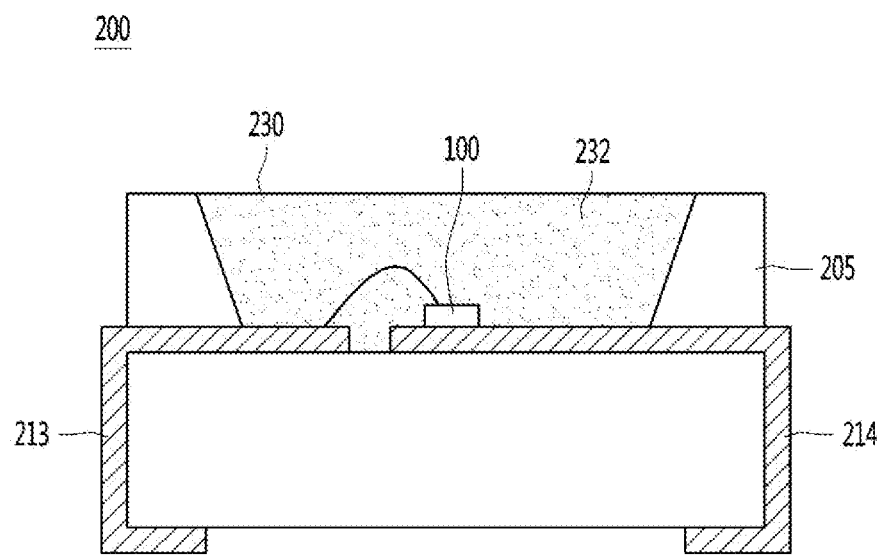

ULTRAVIOLET LIGHT EMITTING DIODE AND LIGHT EMITTING DIODE PACKAGE

CROSS-REFERENCE TO RELATED PATENT APPLICATIONS

This application is a U.S. National Stage Application under 35 U.S.C. § 371 of PCT Application No. PCT/KR2016/008116, filed Jul. 25, 2016, which claims priority to Korean Patent Application No. 10-2015-0105196, filed Jul. 24, 2015, whose entire disclosures are hereby incorporated by reference.

BACKGROUND

Field of the Present Disclosure

An embodiment relates to an ultraviolet light-emitting device, a method for manufacturing an ultraviolet light-emitting device, a light-emitting device package and an illumination apparatus.

Discussion of Related Art

A light-emitting device or light emitting diode includes a p-n junction diode having a property of converting electric energy into light energy, where such a diode may be produced by combining elements of Group III and Group V on the periodic table, and thereby various colors may be realized by controlling the composition ratio of the compound semiconductor.

Nitride semiconductors have high thermal stability and wide bandgap energies, which are of great interest in the technical field of developing optical devices and high power electronic devices. In particular, ultraviolet (UV) light-emitting devices, blue light-emitting devices, green light-emitting devices, and red light-emitting devices using nitride semiconductors are widely used in commercial applications.

The ultraviolet light-emitting device (UV LED) is a light-emitting device emitting light in a wavelength range of 200 nm to 400 nm. The ultraviolet light-emitting device consists of short wavelength and long wavelength devices depending on the application. The short wavelength device may be used for sterilization or purification, and the long wavelength device may be used for an exposure machine or a hardener.

On the other hand, in the conventional light-emitting device, there is a droop problem in which the luminous efficiency is lowered when the amount of injected current is increased. This problem occurs because the efficiency of injection of carriers (holes or electrons) into the light-emitting layer is not uniform. To solve this problem, it is required to develop a technique that allows most quantum wells of the light-emitting layer to substantially participate in luminescence.

In addition, the ultraviolet light-emitting device has a lower composition of indium (In) in a quantum well than a light-emitting device exhibiting a conventional blue visible light region. Taking this into consideration, a technique capable of increasing the luminous efficiency is required.

SUMMARY

An embodiment is to provide an ultraviolet light-emitting device capable of improving luminous efficiency, a method for manufacturing the ultraviolet light-emitting device, a light-emitting device package including the device, and an illumination apparatus including the device.

An embodiment is to provide an ultraviolet light-emitting device capable of improving luminous intensity, a method for manufacturing the ultraviolet light-emitting device, a light-emitting device package including the device, and an illumination apparatus including the device.

In one aspect of the present disclosure, there is provided an ultraviolet light-emitting device comprising: a first conductive-type semiconductor layer; an active layer comprising a multiple quantum barrier and multiple quantum well and disposed on the first conductive-type semiconductor layer; a second conductive-type first semiconductor layer disposed on the active layer; an electron blocking layer disposed between the active layer and the second conductive-type first semiconductor layer; and a second conductive-type second semiconductor layer disposed between the last quantum barrier of the active layer and the electron blocking layer, wherein the second conductive-type second semiconductor layer includes a p-type $Al_{x1}Ga_{1-x1}N$ layer ($0 \leq x1 \leq 1$) and a p-type $In_yAl_{x2}Ga_{1-y-x2}N$ layer ($0 \leq x2 \leq 1$, $0 \leq y \leq 1$, $0 \leq x2+y \leq 1$).

In another aspect of the present disclosure, there is provided a light-emitting device package comprising the ultraviolet light-emitting device as defined above.

The ultraviolet light-emitting device according to the embodiment can improve the luminous efficiency by reducing the pit density and improving the crystallinity.

The ultraviolet light-emitting device according to the embodiment can improve the electron blocking efficiency.

The ultraviolet light-emitting device according to the embodiment can maintain the operating voltage and wavelength and improve the luminous intensity.

BRIEF DESCRIPTION OF THE DRAWINGS

FIG. 1 is a cross-sectional view of an ultraviolet light-emitting device according to an embodiment.

FIG. 2 shows a band diagram of a light-emitting device according to an embodiment.

FIG. 3 is a graph comparing the light emission characteristics and the output voltage between a comparison example and an embodiment.

FIGS. 4 to 7 illustrate a method for fabricating an ultraviolet light-emitting device according to an embodiment.

FIG. 8 is a cross-sectional view of a light-emitting device package according to an embodiment.

DETAILED DESCRIPTIONS

In the description of the embodiments, when layers (films), regions, patterns or structures are described as being formed on or under or over substrates, layers (films), regions, pads or patterns, this means that the layers (films), regions, patterns or structures are disposed directly on or under or over the substrates, layers (films), regions, pads or patterns or indirectly on or under or over the substrates, layers (films), regions, pads or patterns via another substrate, layer (film), region, pad or pattern. In addition, spatially relative terms, such as "beneath," "below," "lower," "under," "above," "upper," and the like, may be used herein with reference to the drawings.

FIG. 1 is a cross-sectional view of an ultraviolet light-emitting device according to an embodiment.

As shown in FIG. 1, an ultraviolet light-emitting device 100 according to an embodiment may include a light emitting structure 110.

The light-emitting structure 110 may include a first conductive-type semiconductor layer 112, an active layer 114, and a second conductive-type semiconductor layer 116.

The first conductive-type semiconductor layer 112 may be located over the active layer 114, and the second conductive-type semiconductor layer 116 may be located below the active layer 114.

The ultraviolet light-emitting device 114 may include a first electrode 150 disposed over the first conductive-type semiconductor layer 114.

The ultraviolet light-emitting device 100 according to an embodiment may include a current blocking layer 161, a channel layer 163 and a second electrode 170 under the light-emitting structure 110.

The second electrode 170 may include a contact layer 165, a reflective layer 167, and a bonding layer 169.

The ultraviolet light-emitting device 100 according to an embodiment may be a vertical type light-emitting device in which the first electrode 150 is located over the light-emitting structure 110 and the second electrode 170 is located below the light-emitting structure 110. The present invention is not limited thereto. The present invention is also applicable to a horizontal type light-emitting device in which both electrodes are disposed over the light-emitting structure.

FIG. 2 shows a band diagram of a light-emitting device according to an embodiment.

As shown in FIG. 2, the light-emitting device according to an embodiment may include the active layer 114 located between the first conductive-type semiconductor layer 112 and the second conductive-type first semiconductor layer 116. In this connection, an electron blocking layer (EBL) 122 may be disposed between the active layer 114 and the second conductive-type first semiconductor layer 116. The present invention is not limited thereto.

The active layer 114 may include a multiple quantum barrier 114B and a multiple quantum well 114W. When the active layer 114 is implemented in the multiple quantum well structure, the quantum well and quantum barrier may be alternately arranged.

The light-emitting device according to an embodiment may include the second conductive-type second semiconductor layer 130 disposed between the active layer 114 and the second conductive-type first semiconductor layer 116. The second conductive-type second semiconductor layer 130 may be disposed between the active layer 114 and the electron blocking layer 122. The second conductive-type second semiconductor layer 130 may be disposed adjacent to the last quantum well 114 WL and the last quantum barrier 114 BL of the active layer 114. The second conductive-type second semiconductor layer 130 may be disposed between the last quantum barrier 114BL and the electron blocking layer 122.

The second conductive-type second semiconductor layer 130 may suppresses a decrease in crystallinity due to a difference in composition between the active layer 114 and the electron blocking layer 122, and may suppress a decrease in the luminous intensity Po due to the pit resulting from the difference in composition. The second conductive-type second semiconductor layer 130 may reduce the lattice constant difference between the active layer 114 and the electron blocking layer 122 to improve the crystallinity of the electron blocking layer 122 and the second conductive-type first semiconductor layer 116 as grown after the second conductive-type second semiconductor layer 130. That is, the second conductive-type second semiconductor layer 130 reduces the density of pits that may be otherwise generated due to the difference in aluminum (Al) composition between the last quantum barrier 114BL and the electron blocking layer 122 and improves the crystallinity of the electron blocking layer 122. In addition, the second conductive-type second semiconductor layer 130 has a higher band gap energy than the electron blocking layer 122, thereby improving the electron blocking efficiency.

The second conductive-type second semiconductor layer 130 may include a p-type $Al_{x1}Ga_{1-x1}N$ layer ($0 \leq x1 \leq 1$) 131 and a p-type $In_yAl_{x2}Ga_{1-y-x2}N$ layer ($0 \leq x2 \leq 1$, $0 \leq y \leq 1$, $0 \leq x2+y \leq 1$) 133. The p-type $In_yAl_{x2}Ga_{1-y-x2}N$ layer 133 may be disposed between the p-type $Al_{x1}Ga_{1-x1}N$ layer 131 and the electron blocking layer 122. The p-type $Al_{x1}Ga_{1-x1}N$ layer 131 may be disposed between the p-type $In_yAl_{x2}Ga_{1-y-x2}N$ layer 133 and the last quantum barrier 114BL. The p-type $In_yAl_{x2}Ga_{1-y-x2}N$ layer 133 may be disposed between the p-type $Al_{x1}Ga_{1-x1}N$ layer 131 and the electron blocking layer 122.

The p-type $In_yAl_{x2}Ga_{1-y-x2}N$ layer 133 may improve the crystallinity by alleviating the aluminum (Al) compositional difference between the last well barrier 114BL and the electron blocking layer 122, and reduces the pit density by containing the indium (In) composition therein.

The aluminum (Al) composition x1 of the p-type $Al_{x1}Ga_{1-x1}N$ layer 131 may be 0.12 or more. For example, the aluminum (Al) composition x1 of the p-type $Al_{x1}Ga_{1-x1}N$ layer 131 may be 0.12 to 0.25, but is not limited thereto. When the aluminum (Al) composition x1 of the p-type $Al_{x1}Ga_{1-x1}N$ layer 131 is less than 0.12, the electron blocking effect may be lowered. When the aluminum (Al) composition x1 of the p-type $Al_{x1}Ga_{1-x1}N$ layer 131 is more than 0.25, the suppression of notch may not be realized efficiently.

The aluminum (Al) composition x2 of the p-type $In_yAl_{x2}Ga_{1-y-x2}N$ layer 133 may be 0.25 or more. For example, the aluminum (Al) composition x2 of the p-type $In_yAl_{x2}Ga_{1-y-x2}N$ layer 133 may be 0.25 to 0.45, but is not limited thereto. When the aluminum (Al) composition x2 of the p-type $In_yAl_{x2}Ga_{1-y-x2}N$ layer 133 is less than 0.25, the electron blocking effect may be lowered. When the aluminum (Al) composition x2 of the p-type $In_yAl_{x2}Ga_{1-y-x2}N$ layer 133 is more than 0.45, the crystallinity may be lowered due to the high aluminum (Al) composition and the hole injection efficiency may be lowered.

The indium (In) composition y of the p-type $In_yAl_{x2}Ga_{1-y-x2}N$ layer 133 may be 0.01 or more. For example, the indium (In) composition y of the p-type $In_yAl_{x2}Ga_{1-y-x2}N$ layer 133 may be 0.01 to 0.2, but is not limited thereto. When the indium (In) composition y of the p-type $In_yAl_{x2}Ga_{1-y-x2}N$ layer 133 is less than 0.01, it may be difficult to reduce the pit density. When the indium (In) composition y of the p-type $In_yAl_{x2}Ga_{1-y-x2}N$ layer 133 is more than 0.2, the band gap energy of the p-type $In_yAl_{x2}Ga_{1-y-x2}N$ layer 133 is lowered, and, thus, the electron blocking effect may be lowered.

The p-type $Al_{x1}Ga_{1-x1}N$ layer 131 may be disposed between the last quantum barrier 114BL and the p-type $In_yAl_{x2}Ga_{1-y-x2}N$ layer 133. The bandgap energy of the p-type $Al_{x1}Ga_{1-x1}N$ layer 131 may be between the bandgap energy of the last quantum barrier 114BL and the bandgap energy of the electron blocking layer 122. The p-type $Al_{x1}Ga_{1-x1}N$ layer 131 may have a median bandgap energy between a bandgap energy of the last quantum barrier 114BL and the bandgap energy of the electron blocking layer 122. The band gap energy of the p-type $Al_{x1}Ga_{1-x1}N$ layer 131 may have a band gap energy between the last quantum barrier 114BL and the p-type $In_yAl_{x2}Ga_{1-y-x2}N$ layer 133.

The p-type $Al_{x1}Ga_{1-x1}N$ layer 131 may alleviate the bandgap energy difference between the last quantum barrier 144BL and the p-type $In_yAl_{x2}Ga_{1-y-x2}N$ layer 133 having a larger bandgap energy than the electron blocking layer 122.

The p-type $In_yAl_{x2}Ga_{1-y-x2}N$ layer 133 may be disposed between the p-type $Al_{x1}Ga_{1-x1}N$ layer 131 and the electron blocking layer 122. The p-type $In_yAl_{x2}Ga_{1-y-x2}N$ layer 133 may be disposed between the last quantum barrier 144BL and the electron blocking layer 122. The p-type $In_yAl_{x2}Ga_{1-y-x2}N$ layer 133 may be disposed between the second conductive-type layer 116 and p-type $Al_{x1}Ga_{1-x1}N$ layer 131. The band gap energy of the p-type $In_yAl_{x2}Ga_{1-y-x2}N$ layer 133 may be higher than a band gap energy of the electron blocking layer 122. The band gap energy of the p-type $In_yAl_{x2}Ga_{1-y-x2}N$ layer 133 may be higher than a band gap of the p-type $Al_{x1}Ga_{1-x1}N$ layer 131. The band gap energy of the p-type $In_yAl_{x2}Ga_{1-y-x2}N$ layer 133 may be higher than a band gap of the second conductive-type first semiconductor 116.

The thickness of each of the p-type $Al_{x1}Ga_{1-x1}N$ layer 131 and the p-type $In_yAl_{x2}Ga_{1-y-x2}N$ layer 133 may be 0.5 nm. For example, the thickness of each of the p-type $Al_{x1}Ga_{1-x1}N$ layer 131 and the p-type $In_yAl_{x2}Ga_{1-y-x2}N$ layer 133 may be 0.5 nm to 1.5 nm. When the thickness of the p-type $In_yAl_{x2}Ga_{1-y-x2}N$ layer 133 is less than 0.5 nm, the effect of reducing the pit density may be deteriorated. When the thickness of the p-type $In_yAl_{x2}Ga_{1-y-x2}N$ layer 133 is more than 1.5 nm, the hole injection efficiency may be lowered due to the high aluminum (Al) composition.

For example, comparing the embodiment with the comparison example, the pit density in the comparison example is $2.16 \times 10E8/cm^2$, and the pit density according to the embodiment is $1.2 \times 10E8/cm^2$. Thus, in the present embodiment, the second conductive-type second semiconductor layer made of p-type AlGaN/p-type InAlGaN is disposed between the last quantum barrier and the electron blocking layer to reduce the pit density and thus improve the luminous efficiency.

The RMS value in the comparison example may be obtained based on the AFM roughness data. In the comparison example, the RMS value is 0.2325 on the basis of 5 μm×5 μm and is 0.2928 on the basis of 10 μm×10 μm. In the present embodiment, the RMS is 0.2229 on the basis of 5 μm×5 μm and is 0.2859 on the basis of 10 μm×10 μm. Therefore, it may be seen that the embodiment has a lower RMS value than the comparison example, thus improving the crystallinity.

TABLE 1

|  | Luminous intensity (Po) | Operation voltage (VF3) |
| --- | --- | --- |
| Comparison example | 712.5 | 3.87 |
| Present embodiment | 728.7 | 3.86 |

Referring to Table 1, the ultraviolet light-emitting device according to the embodiment (FIG. 2) has an improved luminous intensity (Po) while maintaining the operating voltage as compared with the comparison example.

That is, in the ultraviolet light-emitting device according to the embodiment where the second conductive-type second semiconductor layer made of p-type AlGaN/p-type InAlGaN is disposed between the last quantum barrier and the electron blocking layer, it is possible to reduce the pit density and maximize the electron blocking, thereby to improve the luminous intensity (Po) while maintaining the operating voltage VF3 and the wavelength.

Referring to FIG. 3, the light emission characteristic PL and the output voltage V are compared between the comparison example and the embodiment.

FIG. 3 is a graph comparing the light emission characteristics and the output voltage between the comparison example and the embodiment.

Referring to FIG. 3a, the optical emission characteristics PL show that the crystallinity of the light-emitting device according to the embodiment is improved compared to the comparison example. The crystallinity of the light-emitting device is closely related to luminous intensity Po and light efficiency. That is, the embodiment may improve the luminous intensity Po and the light efficiency because the crystallinity of the light-emitting device is improved.

Further, referring to FIG. 3b, the output voltage V according to the embodiment may be larger than that in accordance with the comparison example. That is, the embodiment improves the crystallinity of the light-emitting device and thus improves the electrical characteristics, thereby improving the luminous intensity Po and the light efficiency.

FIGS. 4 to 7 illustrate a method for fabricating an ultraviolet light-emitting device according to an embodiment.

Referring to FIG. 4, a buffer layer 106 may be formed on a substrate 105.

The substrate 105 may be formed of a material having excellent thermal conductivity, and may be a conductive substrate or an insulating substrate. For example, the substrate 105 may be made of at least one of sapphire Al2O3, SiC, Si, GaAs, GaN, ZnO, GaP, InP, Ge, and Ga2O3. The concavo-convex structure may be formed on the substrate 105, but the present invention is not limited thereto.

The buffer layer 106 reduces the lattice constant difference between the substrate 105 and the nitride semiconductor layer. The material of the buffer layer may be selected from GaN, AlN, AlGaN, InGaN, InN, InAlGaN, AlInN, AlGaAs, GaP, GaAs, GaAsP and AlGaInP. For example, the buffer layer 106 may be made of undoped GaN, but the present disclosure is not limited thereto.

The buffer layer 106 may be one or more layers. That is, the buffer layer 106 may be a stack of two or more layers.

Referring to FIG. 5, the light-emitting structure 110 including the first conductive-type semiconductor layer 112, the active layer 114, and the second conductive-type first semiconductor layer 116 may be formed on the buffer layer 106.

The first conductive-type semiconductor layer 112 may be made of a semiconductor compound, for example, a Group II-IV semiconductor compound or a Group III-V compound semiconductor, and may be doped with a first conductive-type dopant. For example, the first conductive-type semiconductor layer 112 may include a semiconductor material having a composition of $AlInGa_{1-n}N$ (0≤n≤1). When the first conductive-type semiconductor layer 112 is embodied as an n-type semiconductor layer, the n-type dopant may include Si, Ge, Sn, Se, and Te, but the disclosure is not limited thereto.

The active layer 114 may be formed on the first conductive-type semiconductor layer 112. In the active layer 114, an electron or hole injected through the first conductive-type semiconductor layer 112 and a hole or electron injected through the second conductive-type first semiconductor layer 116 meet with each other. Thus, light is emitted due to a band gap difference of an energy band depending on the material of the active layer 114.

The active layer 114 may be composed of a compound semiconductor. The active layer 114 may be implemented as at least one of Group II-IV compound semiconductors and Group III-V compound semiconductors.

The active layer 114 may include a quantum well and a quantum barrier. When the active layer 114 is implemented in a multiple quantum well structure, quantum wells and quantum barriers may be alternately arranged. Each of the quantum well and the quantum barrier may be made of a semiconductor material having a composition of $In_xAl_yGa_{1-x-y}N$ ($0 \le x \le 1$, $0 \le y \le 1$, $0 \le x+y \le 1$). Alternatively, each of the quantum well and the quantum barrier may be composed of one or more pair of AlGaN/GaN, AlGaN/AlGaN, InGaN/GaN, InGaN/InGaN, InAlGaN/GaN, GaAs/AlGaAs, InGaAs/AlGaAs, GaP/AlGaP, InGaP AlGaP. However, the present invention is not limited thereto.

The second conductive-type first semiconductor layer 116 may be formed of a semiconductor compound, for example, a Group II-IV compound semiconductor or a Group III-V compound semiconductor, and may be doped with a second conductive-type dopant. For example, the second conductive-type first semiconductor layer 116 may include a semiconductor material having a composition of $Al_pGa_{1-p}N$ ($0 \le p \le 1$). When the second conductive-type first semiconductor layer 116 is embodied as a p-type semiconductor layer, the second conductive-type dopant may be a p-type dopant, and may include Mg, Zn, Ca, Sr, and Ba.

The light emitting structure 110 may include the second conductive-type second semiconductor layer 130 disposed between the active layer 114 and the second conductive-type first semiconductor layer 116. The second conductive-type second semiconductor layer 130 suppresses the crystallinity deterioration caused by the composition difference between the active layer 114 and the electron blocking layer 122, and suppresses the luminous intensity Po drop caused by the pit. The second conductive-type second semiconductor layer 130 may include a p-type $Al_{x1}Ga_{1-x1}N$ layer and a p-type $In_yAl_{x2}Ga_{1-y-x2}N$ layer. The p-type $In_yAl_{x2}Ga_{1-y-x2}N$ layer may be disposed between the p-type $Al_{x1}Ga_{1-x1}N$ layer and the electron blocking layer 122. The p-type $In_yAl_{x2}Ga_{1-y-x2}N$ layer improves crystallinity by alleviating the difference in aluminum (Al) composition between the last quantum barrier and the electron blocking layer 122, and reduces the pit density by containing indium (In) composition therein.

The first conductive-type semiconductor layer 112 may be a p-type semiconductor layer, and the second conductive-type first semiconductor layer 116 may be an n-type semiconductor layer. The present invention is not limited thereto.

Referring to FIG. 6, the ultraviolet light-emitting device according to an embodiment may include the current blocking layer 161, the channel layer 163, and the second electrode 170, all of which are disposed under the light-emitting structure 110.

The current blocking layer 161 may include at least one of SiO2, SiOx, SiOxNy, Si3N4, Al2O3, TiO2. At least one current blocking layer 161 may be formed between the light-emitting structure 110 and the second electrode 170.

The current blocking layer 161 is disposed to correspond to the first electrode 150 disposed over the light-emitting structure 110 in the thickness direction of the light-emitting structure 110. The current blocking layer 161 may cut off the current supplied from the second electrode 170 and thus diffuse the current to another path.

The channel layer 163 may be formed around a periphery of the lower side face of the second conductive-type AlGaN-based semiconductor layer 116, and may be formed in a ring shape, a loop shape, or a frame shape. The channel layer 163 may include at least one of ITO, IZO, IZTO, IAZO, IGZO, IGTO, AZO, ATO, SiO2, SiOx, SiOxNy, Si3N4, Al2O3, TiO2. The inner portion of the channel layer 163 is disposed under the second conductive-type AlGaN-based semiconductor layer 116, and the outer portion of the channel layer may be disposed further outward than the side face of the light emitting structure 110.

The second electrode 170 may include the contact layer 165, the reflective layer 167, and the bonding layer 169.

The contact layer 165 may be formed by stacking a single metal, a metal alloy, and/or a metal oxide so as to efficiently perform carrier injection. The contact layer 165 may be formed of a material having excellent electrical contact with a semiconductor. For example, the contact layer 165 may include at least one of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO Nitride), AGZO (Al—Ga ZnO), IGZO (In—Ga ZnO), ZnO, IrOx, RuOx, NiO, RuOx/ITO, Ni/IrOx/Au, and Ni/IrOx/Au/ITO, Ag, Ni, Cr, Ti, Al, Rh, Pd, Ir, Ru, Mg, Zn, Pt, Au, Hf. The present invention is not limited thereto.

The reflective layer 167 may be positioned on the contact layer 165. The reflective layer 167 may be formed of a material having excellent reflectivity and excellent electrical contact. For example, the reflective layer 167 may be formed of a metal or an alloy containing at least one of Ag, Ni, Al, Rh, Pd, Ir, Ru, Mg, Zn, Pt, Au, Hf.

The reflective layer 167 may be formed of a single layer or a multilayer using the metal or alloy and a transparent conductive material such as IZO, IZTO, IAZO, IGZO, IGTO, AZO, or ATO. For example, the reflective layer 167 may include a stack such as IZO/Ni, AZO/Ag, IZO/Ag/Ni, AZO/Ag/Ni.

The bonding layer 169 may be formed under the reflective layer 167. The bonding layer 169 may be formed of a barrier metal or a bonding metal. The material of the bonding layer may include at least one of Ti, Au, Sn, Ni, Cr, Ga, In, Bi, Cu, Ag and Ta and an alloy thereof.

A support member 173 may be formed under the bonding layer 169. The support member 173 may be formed of a conductive member. The material of the support member may be a conductive material such as Cu-copper, Au-gold, Ni-nickel, molybdenum-Mo, copper-tungsten Cu—W, a carrier wafer (e.g. Si, Ge, GaAs, ZnO, SiC). As another example, the support member 173 may be embodied as a conductive sheet.

Referring to FIG. 7, the substrate (105 in FIG. 6), and the buffer layer (106 in FIG. 6) may be removed from the light-emitting structure 110. For example, the substrate (105 in FIG. 6) and the buffer layer (106 in FIG. 6) may be removed by a chemical etching method.

The substrate (105 in FIG. 6) and the buffer layer (106 in FIG. 6) are removed, and, thus, the exposed first conductive-type semiconductor layer 112 defines a light extraction pattern 119 defined therein for improving light extraction efficiency. The light extraction pattern 119 may be formed by PEC or the like, but the present invention is not limited thereto. The light extraction pattern 119 may be formed to have a regular shape and arrangement. Alternatively, the light extraction pattern 119 may be formed to have an irregular shape and arrangement.

The light extracting pattern 119 may refract light generated from the active layer 114 to the outside to improve light extraction efficiency.

The light-emitting device according to an embodiment may include the second conductive-type second semiconductor layer 130 disposed between the active layer 114 and the second conductive-type first semiconductor layer 116. The second conductive-type second semiconductor layer 130 suppresses the crystallinity deterioration caused by the composition difference between the active layer 114 and the electron blocking layer 122, and suppresses the luminous intensity Po degradation due to the pit. The second conductive-type second semiconductor layer 130 may include a p-type Alx1Ga1-x1N layer and p-type InyAlx2Ga1-y-x2N layer. The p-type InyAlx2Ga1-y-x2N layer may be disposed between the p-type Alx1Ga1-x1N layer and the electron blocking layer 122. The p-type InyAlx2Ga1-y-x2N layer improves crystallinity by alleviating the difference in aluminum Al composition between the last quantum barrier and the electron blocking layer 122, and reduces the pit density by containing indium (In) composition therein.

The ultraviolet light-emitting device according to an embodiment may include the first electrode 150.

The first electrode 150 may be located over the first conductive-type semiconductor layer 112.

The ultraviolet light-emitting device 100 according to an embodiment may be a vertical type light-emitting device in which the first electrode 150 is located over the light-emitting structure 110 and the second electrode 170 is located below the light-emitting structure 110. The present invention is not limited thereto. The present invention is also applicable to a horizontal type light-emitting device in which both electrodes are disposed over the light-emitting structure.

FIG. 8 is a cross-sectional view of a light-emitting device package according to an embodiment.

A light emitting device package 200 according to an embodiment includes a package body 205, a first lead electrode 213 and a second lead electrode 214 provided on the package body 205, an ultraviolet light-emitting device 100 installed on the package body 205 and electrically connected to the first lead electrode 213 and the second lead electrode 214, and a molding member 230 surrounding the ultraviolet light-emitting device 100.

The first lead electrode 213 and the second lead electrode 214 are electrically isolated from each other and provide power to the ultraviolet light-emitting device 100. In addition, the first lead electrode 213 and the second lead electrode 214 may include a function of reflecting light emitted from the ultraviolet light-emitting device 100 to increase light efficiency. The first lead electrode 213 and the second lead electrode 214 may include a function of discharging heat generated in the ultraviolet light-emitting device 100 to the outside.

The ultraviolet light-emitting device 100 may be electrically connected to the first lead electrode 213 or the second lead electrode 214 by a wire, flip chip or die bonding method.

The ultraviolet light-emitting device 100 may employ the technical features of the ultraviolet light-emitting device of FIG. 2.

In the molding member 230, a phosphor 232 may be included to form a light-emitting device package of white light. The present invention is not limited thereto.

The top face of the molding member 230 may be flat, concave or convex, but the present invention is not limited thereto.

The light-emitting device according to an embodiment may be applied to a backlight unit, a lighting unit, a display device, a pointing device, a lamp, a streetlight, a lighting apparatus for a vehicle, a vehicle display device, a smart watch, and the like.

The features, structures, effects, and the like described in the embodiments are included in at least one embodiment and are not necessarily limited to one embodiment. Furthermore, the features, structures, effects, etc. illustrated in the various embodiments may be combined or modified in other embodiments by those skilled in the art to which the embodiments belong. Accordingly, the details of such combinations and modifications are to be construed as included within the scope of the embodiments.

Having described the invention with reference to the above embodiments, it is to be understood that such embodiments are merely illustrative and not restrictive of the present disclosure. Those of ordinary skill in the art to which the embodiment belongs will recognize that various modifications and substitutions to the extent not inconsistent with the present invention may be made without departing from the essential characteristics of the present embodiments. For example, each component specifically illustrated in the embodiment may be modified. It is also to be understood that such variations and substitutions are intended to be included within the scope of the embodiments as defined in the appended claims.

What is claimed is:

1. An ultraviolet light emitting device comprising:
a first conductive-type semiconductor layer;
an active layer comprising a multiple quantum barrier and a multiple quantum well and disposed on the first conductive-type semiconductor layer;
a second conductive-type first semiconductor layer disposed on the active layer;
an electron blocking layer disposed between the active layer and the second conductive-type first semiconductor layer; and
a second conductive-type second semiconductor layer disposed between the last quantum wall of the active layer and the electron blocking layer,
wherein the second conductive-type second semiconductor layer includes a p-type $Al_{x1}Ga_{1-x1}N$ layer (0≤x1≤1) and a p-type $In_yAl_{x2}Ga_{1-y-x2}N$ layer (0≤x2≤1, 0≤y≤1, 0≤x2+y≤1).

2. The ultraviolet light emitting of claim 1, wherein the p-type $In_xAl_{x2}Ga_{1-y-x2}N$ layer is disposed between the p-type $Al_{x1}Ga_{1-x1}N$ layer and the electron blocking layer.

3. The ultraviolet light emitting of claim 2, wherein an aluminum (Al) composition x1 of the p-type Alx1Ga1-x1N layer is 0.12 to 0.25.

4. The ultraviolet light emitting of claim 3, wherein an indium (In) composition y of the p-type InyAlx2Ga1-y-x2N layer is 0.01 to 0.2.

5. The ultraviolet light emitting of claim 3, wherein each of the p-type Alx1Ga1-x1N layer and the p-type InyAlx2Ga1-y-x2N layer has a thickness of 0.5 nm to 1.5 nm.

6. The ultraviolet light emitting of claim 1, wherein an aluminum (Al) composition x2 of the p-type InyAlx2Ga1-y-x2N layer is 0.25 to 0.45.

7. The ultraviolet light emitting of claim 1, wherein the p-type Alx1Ga1-x1N layer has a bandgap energy between a bandgap energy of the last quantum wall and a bandgap energy of the electron blocking layer, wherein p-type $Al_{x1}Ga_{1-x1}N$ layer is disposed between the last quantum barrier and the p-type $In_xAl_{x2}Ga_{1-y-x2}N$ layer.

8. The ultraviolet light emitting of claim 7, wherein the p-type $Al_{x1}Ga_{1-x1}N$ layer has a bandgap energy between a bandgap energy of the last quantum barrier and a bandgap energy of the electron blocking layer.

9. The ultraviolet light emitting of claim 8, wherein the p-type $Al_{x1}Ga_{1-x1}N$ layer has median bandgap energy between the bandgap energy of the last quantum barrier and the bandgap energy of the p-type $In_yAl_{x2}Ga_{1-y-x2}N$ layer.

10. The ultraviolet light emitting device of claim 9, wherein a bandgap energy of the p-type $In_yAl_{x2}Ga_{1-y-x2}N$ layer is higher than a bandgap energy of the second conductive-type first semiconductor layer.

11. The ultraviolet light emitting device of claim 8, wherein the band gap energy of the p-type Alx1Ga1-x1N layer has a band gap energy between the last quantum barrier and the p-type InyAlx2Ga1-y-x2N layer.

12. An ultraviolet light emitting device package comprising:
a package body;
a first lead electrode and a second lead electrode disposed on the package body;
an ultraviolet light emitting device disposed on the package body and electrically connected to the first lead electrode and the second lead electrode; and
a molding member surrounded the ultraviolet light-emitting device;
wherein the ultraviolet light-emitting device comprises a first conductive-type semiconductor layer, an active layer comprising a multiple quantum barrier and a multiple quantum well and disposed on the first conductive-type semiconductor layer, a second conductive-type first semiconductor layer disposed on the active layer, an electron blocking layer disposed between the active layer and the second conductive-type first semiconductor layer; and a second conductive-type second semiconductor layer disposed between the last quantum barrier of the active layer and the electron blocking layer,
wherein the second conductive-type second semiconductor layer includes a p-type $Al_{x1}Ga_{1-x1}N$ layer ($0 \leq x1 \leq 1$) and a p-type $In_xAl_{x2}Ga_{1-y-x2}N$ layer ($0 \leq x2 \leq 1$, $0 \leq y \leq 1$, $0 \leq x2+y \leq 1$).

13. The ultraviolet light emitting device package of claim 12, wherein the p-type $In_xAl_{x2}Ga_{1-y-x2}N$ layer is disposed between the p-type $Al_{x1}Ga_{1-x1}N$ layer and the electron blocking layer.

14. The ultraviolet light emitting device package of claim 13, wherein an aluminum (Al) composition x1 of the p-type $Al_{x1}Ga_{1-x1}N$ layer is 0.12 to 0.25.

15. The ultraviolet light emitting device package of claim 13, wherein each of the p-type $Al_{x1}Ga_{1-x1}N$ layer and the p-type $In_xAl_{x2}Ga_{1-y-x2}N$ layer has a thickness of 0.5 nm to 1.5 nm.

16. The ultraviolet light emitting device package of claim 13, wherein p-type $Al_{x1}Ga_{1-x1}N$ layer is disposed between the last quantum barrier and the p-type $In_xAl_{x2}Ga_{1-y-x2}N$ layer.

17. The ultraviolet light emitting device package of claim 16, wherein the band gap energy of the p-type $Al_{x1}Ga_{1-x1}N$ layer has a band gap energy between the last quantum barrier and the p-type $In_yAl_{x2}Ga_{1-y-x2}N$ layer.

18. The ultraviolet light emitting device package of claim 17, wherein the band gap energy of the p-type $Al_{x1}Ga_{1-x1}N$ layer has a band gap energy between the last quantum barrier and the p-type $In_yAl_{x2}Ga_{1-y-x2}N$ layer.

19. The ultraviolet light emitting device package of claim 17, wherein the p-type $Al_{x1}Ga_{1-x1}N$ layer has a bandgap energy between a bandgap energy of the last quantum barrier and a bandgap energy of the electron blocking layer.

20. The ultraviolet light emitting device package of claim 16, wherein the band gap energy of the p-type $In_yAl_{x2}Ga_{1-y-x2}N$ layer has higher than a band gap of the second conductive-type first semiconductor.

* * * * *